United States Patent
Sasaki

(10) Patent No.: US 6,792,181 B2
(45) Date of Patent: Sep. 14, 2004

(54) WAVELENGTH-MULTIPLEXING BIDIRECTIONAL OPTICAL TRANSMISSION MODULE

(75) Inventor: Seimi Sasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 73 days.

(21) Appl. No.: 10/155,067

(22) Filed: May 28, 2002

(65) Prior Publication Data

US 2003/0128916 A1 Jul. 10, 2003

(30) Foreign Application Priority Data

Jan. 9, 2002 (JP) ........................ 2002-002784

(51) Int. Cl.[7] .............................. G02B 6/34; H04J 14/02
(52) U.S. Cl. .............................. 385/37; 385/24; 385/36; 385/92; 398/79; 398/86; 398/87
(58) Field of Search .............................. 385/36, 37, 31, 385/33, 88, 89, 92, 93, 24; 396/79, 86, 87

(56) References Cited

U.S. PATENT DOCUMENTS

| | | | | |
|---|---|---|---|---|
| 4,643,519 A | * | 2/1987 | Bussard et al. | ............... 385/37 |
| 4,652,080 A | * | 3/1987 | Carter et al. | ................... 385/47 |
| 4,784,935 A | * | 11/1988 | Ehrfeld et al. | ............... 430/321 |
| 5,119,454 A | * | 6/1992 | McMahon | ................... 279/44 |
| 6,008,920 A | * | 12/1999 | Hendrix | ....................... 398/79 |
| 6,525,846 B1 | * | 2/2003 | Yan et al. | ..................... 359/15 |
| 2003/0128916 A1 | * | 7/2003 | Sasaki | ......................... 385/24 |

FOREIGN PATENT DOCUMENTS

| | | | |
|---|---|---|---|
| JP | 61-226713 | 10/1986 | ............... 385/37 X |
| JP | 2000-180671 | 6/2000 | ............... 385/37 X |

* cited by examiner

Primary Examiner—Brian M. Healy
(74) Attorney, Agent, or Firm—Staas & Halsey LLP

(57) ABSTRACT

A wavelength multiplexing bidirectional optical transmission module includes a transparent plate having first and second reflection surfaces opposing each other, a diffraction grating formed on a part of one of the first and second reflection surfaces and photoelectric transfer elements. The diffraction grating receives a wavelength-multiplexed optical signal composed of at least two light beams of proximate wavelength bands and produces diffracted light beams one for each wavelength at different angles. The photoelectric transfer elements receive the diffracted light beams, respectively, that have been reflected and propagated between the first and second reflection surfaces.

10 Claims, 18 Drawing Sheets

WAVELENGTH-MULTIPLEXING BIDIRECTIONAL OPTICAL TRANSMISSION MODULE

BACKGROUND OF THE INVENTION

1. Field of the Invention

The present invention relates to an optical module in the field of optical communication and particularly relates to an optical coupling geometry for bidirectional optical transmission of wavelength-multiplexed signals and a mounting method of such an optical geometry.

Wavelength-multiplexing communication systems are widely applied to communication networks such as a trunk system to deal with increasing network traffic due to rapid growth of the Internet.

In a wavelength-division multiplexing (WDM) system, a plurality of optical signals of different wavelengths are simultaneously transmitted on a single optical fiber. In other words, there are a plurality of channels on a single optical fiber. Therefore, an optical transmission module requires a multiplexing or demultiplexing function (WDM function) for allotting optical signals of different wavelengths and a bidirectional transmission function (send/receive function).

Wavelength multiplexing of optical transmissions is not only applied for trunk communication systems but is also applied for subscriber optical communication systems that extend to office and home environments. FIG. 1 is a diagram showing an example of an optical subscriber communication system that is presently used in practical applications. The system shown in FIG. 1 is a so-called ATM-PON (Passive Optical Network) system with an up-stream transmission of a 1.3 μm band (1260–1360 nm) and a down-stream transmission of a 1.55 μm band (1480–1580 nm). In such a system, transmission is established with one channel for upstream transmission and another channel for downstream transmission.

However, as has been stated above, due to the rapid growth of the Internet, there is a need for providing services at an increased speed and with wider bands in optical subscriber communications.

FIG. 2 shows a system in which the number of wavelengths that are multiplexed is increased to satisfy the need described above. In this system, the 1.55 μm down-stream band is divided to increase number of services to be offered.

On the other hand, a major requirement for optical modules (optical devices) used in such an optical subscriber system is to reduce cost and size.

In order to provide a module that can be applied in the system shown in FIG. 2, a transmitter LD (laser diode), a receiver PD (photo diode), a multiplexing/demultiplexing coupler between the 1.3 μm band and the 1.55 μm band, and a WDM function for dividing the 1.55 μm band are necessary. For the system to become widely used, such functions should be provided with reduced size and cost.

Based on the above, there is an effort of reducing the size and number of components of an optical transmission module and simplifying the assembly process thereof so as to perform mass production at a low cost.

In order to satisfy the above needs, the object of the present invention is to provide a wavelength multiplexing bidirectional optical transmission module of reduced cost and size that can be applied to the optical subscriber communication system of the next generation as shown in FIG. 2.

2. Description of the Related Art

The following description relates to an example of a wavelength multiplexing bidirectional optical transmission module.

FIG. 3 is a diagram showing a structure of a module disclosed in Japanese laid-open patent No. 61-226713 entitled "OPTICAL WAVELENGTH-TRANSMISSION OPTICAL MODULE" (Example 1 of the related art).

The optical module includes a refractive index distribution type rod lens 235, an optical fiber 212.2 for transmission, which is provided on one end of the rod lens 235, and spacer glasses 216–218 provided on the other end of the rod lens 235, each spacer glass having an interference film filter.

A solid-state light-receiving element (for receiving an optical signal of wavelength λ3) 224 having a lens 223-1 is provided at a position along an extension of the central axis of the rod lens 235. Further, a solid-state light-emitting element (for emitting an optical signal of wavelength λ2) 225 having a lens 223-3 and a solid-state light-emitting element (for emitting an optical signal of wavelength λ1) 226 having a lens 223-2 are provided in radial directions of the rod lens 235.

The interference film filter is made of a short-wavelength pass filter or a long-wavelength pass filter.

With the optical module of the above structure, an optical signal of wavelength λ3 propagates through the transmission optical fiber 212.2, and is transmitted through the interference film filters 219, 221 and then received at the solid-state light-receiving element 224.

A light beam of wavelength λ2 from the solid-state light-emitting element 225 is incident on the interference film filter 220 at an angle θ1. The interference film filter 220 is transparent to a light beam of wavelength λ2. Then the light beam of wavelength λ2 is reflected by the interference film filter 219 and is directed to the transmission optical fiber 212.2.

Similarly, a light beam of wavelength λ1 from the solid-state light-emitting element 226 is incident on the interference film filter 222 at an angle θ2. Then the light beam of wavelength λ1 is reflected by the interference film filter 221 and is directed to the transmission optical fiber 212.2.

Accordingly, a three-wave multiplexed bidirectional transmission is achieved.

A more detailed structure of a hybrid-integrated module is known from Japanese laid-open patent application NO. 2000-180671 entitled "structure of an optical send/receive module and a fabrication method thereof" (Example 2 of the related art). FIG. 4 is a diagram showing the structure of such a hybrid integrated module.

An optical fiber 342 is placed inside a ferrule 341. On an end surface of the ferrule 341, a prism-shaped wavelength multiplexing/demultiplexing coupler 343 is fixed that has an interference film filter 344. The interference film filter 344 transmits a light beam of wavelength λ31 along the optical axis of the optical beam and reflects a light beam of wavelength λ32 in a direction perpendicular to the optical axis of the light ray.

An LD package having a light-emitting element 322 for emitting a light beam of wavelength λ31 and a PD package having a light-receiving element 331 for receiving a light beam of wavelength λ32 are provided along the optical axis and in a direction perpendicular to the optical axis, respectively. Both the LD package and the PD package are fixedly supported by a single housing member 311.

With such a structure, a two-way bidirection transmission is achieved. When the above-described example is applied, a three-wave multiplexing transmission can be achieved using a similar technique.

In the field of optical transmission, there is a need for reducing cost and size of optical transmission devices. However, optical transmission devices include expensive optical modules having an optical multiplexing/demultiplexing function and a photoelectric transfer function. Therefore, there is a requirement for improving functions of optical modules with compact integrated structures and with a simplified assembly process at a low cost.

However, in the above-mentioned related art, there are problems as described below.

The interference film filters used in Examples 1 and 2 of the related art are formed of multiple layers of dielectric materials such as $SiO_2$ and $TiO_2$. In order to achieve a wavelength characteristic in which proximate wavelengths are separated at a high extinction ratio, the number of stacked layers of the dielectric film should be increased while accurately controlling the thickness of each layer.

Therefore, conventionally manufacturing a film for separating proximate wavelengths is feasible but will be extremely expensive.

The number of interference film filters required for Examples 1 and 2 of the related art is greater than or equal to the number of wavelengths to be multiplexed and demultiplexed. Therefore, it is difficult to reduce cost required for multiplexing and demultiplexing wavelength-multiplexed signals.

Also, as can be seen from Example 1 of the related art, a plurality of wavelengths can be coupled and decoupled by dispersing optical paths in a plurality of directions.

Accordingly, since the interference film filters are oriented in a plurality of directions, different types of irregular glass blocks and different types of interference film filters should be manufactured and assembled. This is a drawback from mass production of optical transmission devices.

Further, since a number of directions of optical path dispersion for wavelength multiplexing and demultiplexing is limited, the number of wavelengths that can be multiplexed and demultiplexed is also limited.

Also, for a multiplexing/demultiplexing scheme in which one wavelength is transmitted in one direction, the required number of LD or PD packages described in Example 2 of the related art is equal to the number of directions of wavelength multiplexing (multiplexing/demultiplexing).

Accordingly, the number of directions of wavelength decoupling is also limited due to physical arrangements of the LD or PD packages.

There is another problem in that the LD/PD packages are provided with lead terminals that are directed in a plurality of directions and thus the optical transmission device is not suitable for practical use. Thus, there are various problems in providing a compact optical module.

SUMMARY OF THE INVENTION

Accordingly, it is a general object of the present invention to provide an optical transmission module that can obviate the problems described above.

It is another and more specific object of the present invention to provide a wavelength multiplexing bidirectional optical transmission module with reduced size and cost.

In order to achieve the above objects, a wavelength multiplexing bidirectional optical transmission module includes:

a transparent plate having first and second reflection surfaces opposing each other;

a diffraction grating formed on a part of one of the first and second reflection surfaces to receive a wavelength-multiplexed optical signal composed of at least two light beams of a proximate wavelength band and to produce diffracted light beams one for each wavelength at different angles; and photoelectric transfer elements receiving the diffracted light beams, respectively, that have been reflected and propagated between the first and second reflection surfaces.

According to the above-described structure of the present invention, with an optical module that can be applied for a wavelength multiplexing bidirectional optical transmission, a high functionality is achieved in a hybrid integrated module structure that can be readily manufactured by a conventional fabrication process. Thus, such an optical module can be provided with higher functionality, compact structure and at a reduced cost.

DETAILED DESCRIPTION OF THE PREFERRED EMBODIMENTS

In the following, principles and embodiments of the present invention will be described with reference to the accompanying drawings. FIGS. 5 through 18 are diagrams used for explaining the present invention.

Figure 5:
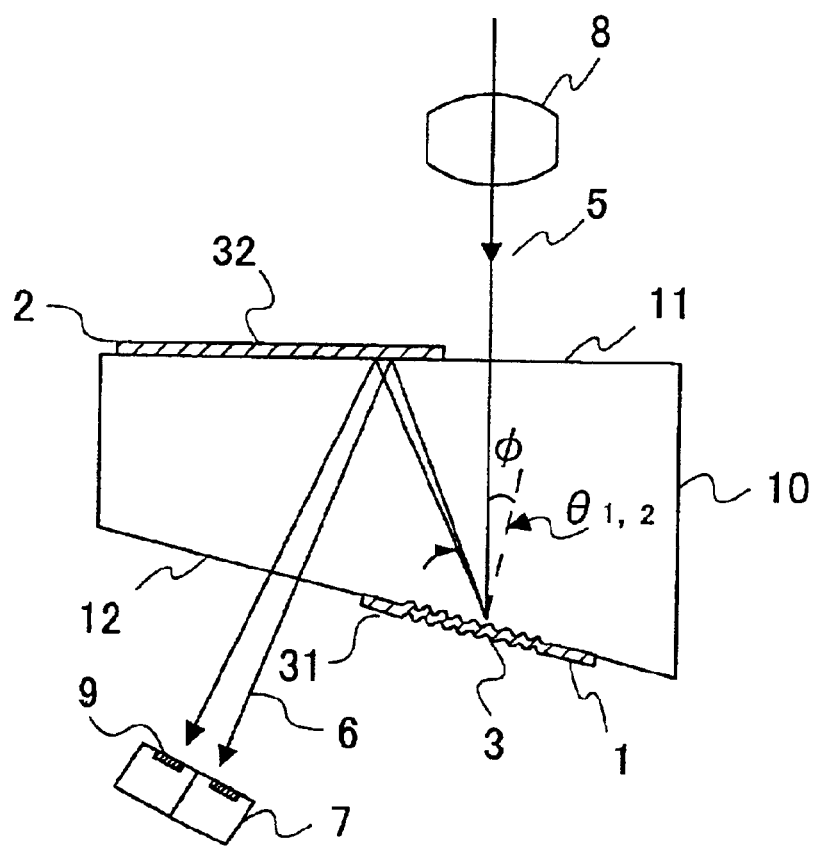
FIG. 5 is a diagram showing how a wavelength-multiplexed light beam is demultiplexed and received according to a first embodiment of the present invention.

FIG. 5 is a diagram showing a structure in which a wavelength-multiplexed optical signal is demultiplexed and received according to the present invention. A plate 10 made of a material transparent to a wavelength band of a wavelength-multiplexed optical signal is provided with first and second reflective surfaces that are formed on opposing faces of the plate 10.

A diffraction grating 3 is formed on a part of one of the reflective surfaces. On the other reflective surface, a transparent window 11 is provided via which the wavelength-multiplexed optical signal propagates through the plate and is incident on the diffraction grating.

The wavelength-multiplexed optical signal 5 is incident on the diffraction grating 3 at an angle φ and diffracted rays are produced at angles θ1 and θ2 that are different for each wavelength. Optical signals 6 that are separated into rays of different wavelengths by diffraction are propagated and reflected between the first and second reflection surfaces at different angles. Therefore, a spatial dispersion distance between the optical signals is increased. With a certain separation distance, optical signals are retrieved from a retrieving window 12 and are received by respective photoelectric transfer elements 7.

A lens 8 is positioned such that the diffracted rays are collected on receiving surfaces 9, respectively, of the photoelectric transfer element 7.

The diffracted rays produced by the diffraction grating 3 are emitted at angles of diffraction θ that satisfy the relationship below:

$$\theta = \sin^{-1}(mN\lambda/n - \sin\phi)$$

where,

φ: angle of incidence of incident beam;

m: order of diffraction (m=0, ±1, ±2, . . . );

N: number of grooves of diffraction grating (number of grooves per unit length);

λ: wavelength (in vacuum); and n: refractive index of the medium via which diffracted rays are emitted.

In FIG. 5, the plate 10 is illustrated as a wedge-shaped plate in which a distance between the first reflection surface 1 and the second reflection surface 2 gradually varies. However, the plate 10 may be a flat plate in which the first reflection surface 1 and the second reflection surface 2 are parallel to each other.

Preferably, the transmission window 11 and the retrieving window 12 are subjected to a reflection-free treatment for wavelength bands of the wavelength-multiplexed signal.

Also, preferably, the diffraction grating 3 is configured such that only a first order diffraction ray (m=1) is produced for the wavelength band of an incident wavelength-multiplexed optical signal.

Further, the diffraction grating may be a blazed grating.

Also, the first and second reflection surfaces may be a metal film or a dielectric multilayered film. Preferably, the reflectivity of the first and second reflection surfaces is 100%.

Figure 6:
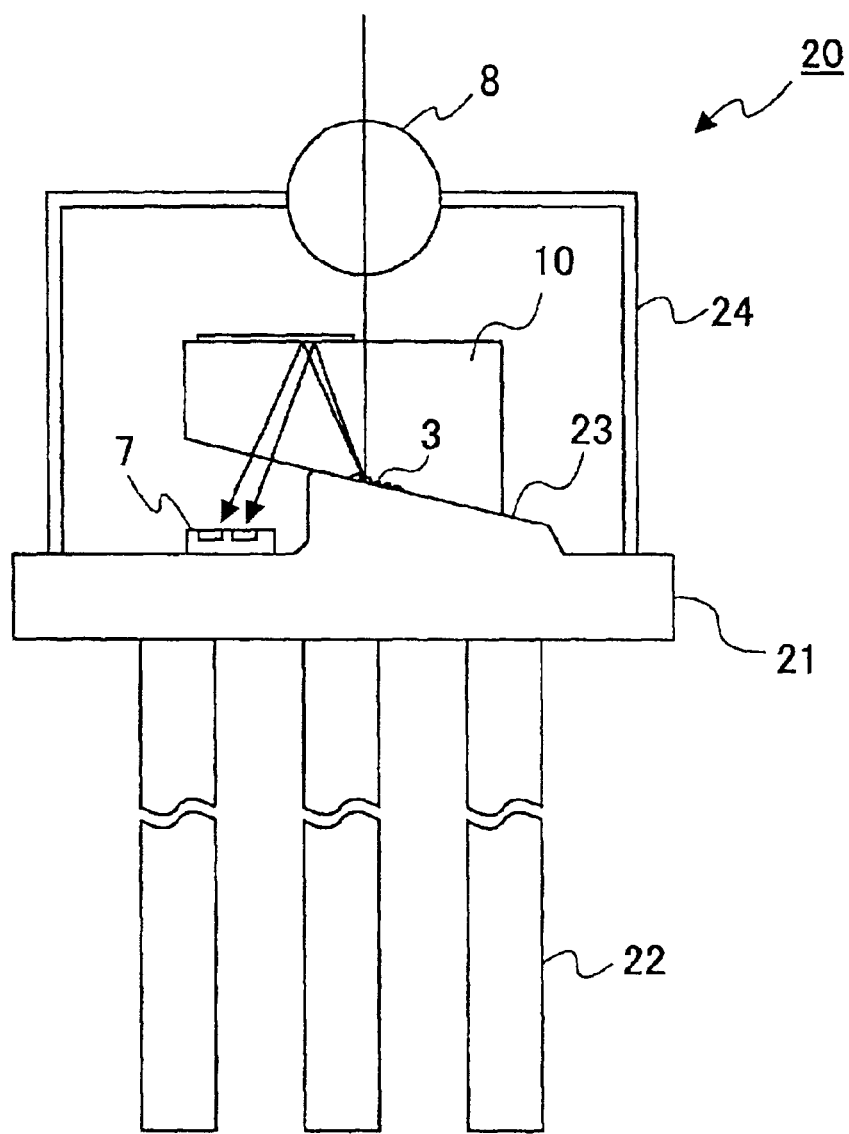
FIG. 6 is a diagram showing a PD package of the first embodiment of the present invention.

FIG. 6 is a diagram showing a PD package of the first embodiment of the present invention that is used as a means for mounting the above-described structure for demultiplexing and receiving optical signals.

The PD package includes a stem 21 having electric lead terminals 22. The photoelectric transfer element 7 and the diffraction grating plate 10 are mounted at predetermined positions on the stem 21. The angle between the reflection surfaces of the wedge-shaped plate 10 and a base 23 whereon the plate is mounted are configured such that the angle of incidence φ of the light beam on the diffraction grating is a predetermined angle.

The lens 8 is formed integral with a cap 24 of the stem 21 so that when the cap 24 is attached to the stem 21 to constitute an optical system, the photoelectric transfer element 7 is hermetically sealed by the cap 24.

Figure 7:
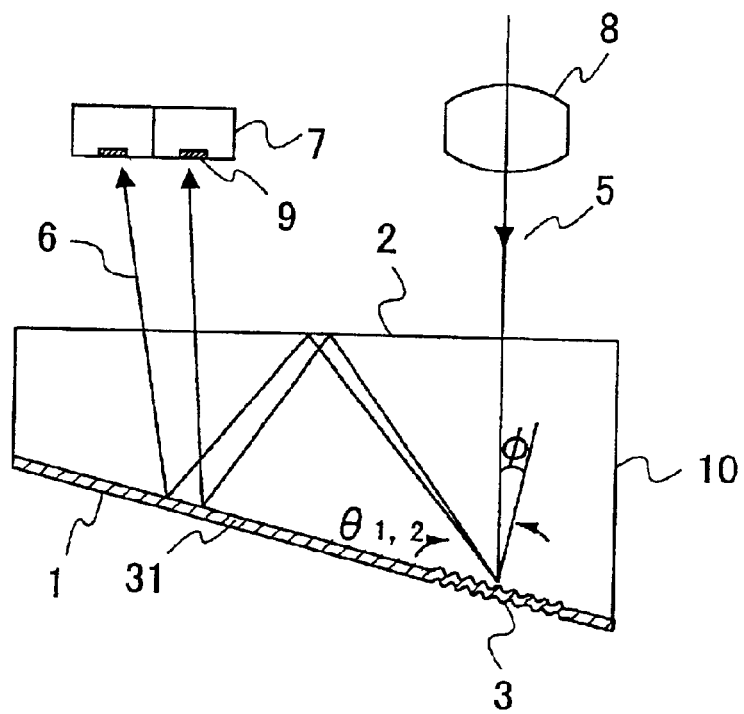
FIG. 7 is a diagram showing how a wavelength-multiplexed light beam is demultiplexed and received according to a second embodiment of the present invention.

FIG. 7 is a diagram showing a further structure in which a wavelength-multiplexed optical signal is demultiplexed and received according to the present invention. In the embodiment shown in FIG. 7, the plate is provided as a wedge-shaped plate in which one of the reflection surfaces is provided with the diffraction grating 3 and a reflective film 31 is formed.

The wavelength-multiplexed optical signal 5 is incident on the diffraction grating 3 at an angle φ and diffracted rays are produced at angles of diffraction θ1 and θ2 that are different for each wavelength. The angle of diffraction θ is selected such that at least the first reflection of the diffracted rays on the first and the second reflection surfaces satisfies the total reflection condition in accordance with Snell's law.

Optical signals 6 that are diffracted into rays of different wavelengths are propagated and reflected between the first and second reflection surfaces and retrieved at a reflection point that does not satisfy the total reflection condition and then received at the photoelectric transfer element 7. The lens 8 is arranged such that the diffracted rays are collected at the receiving surfaces 9, respectively, of the photoelectric transfer element 7.

Figure 8:
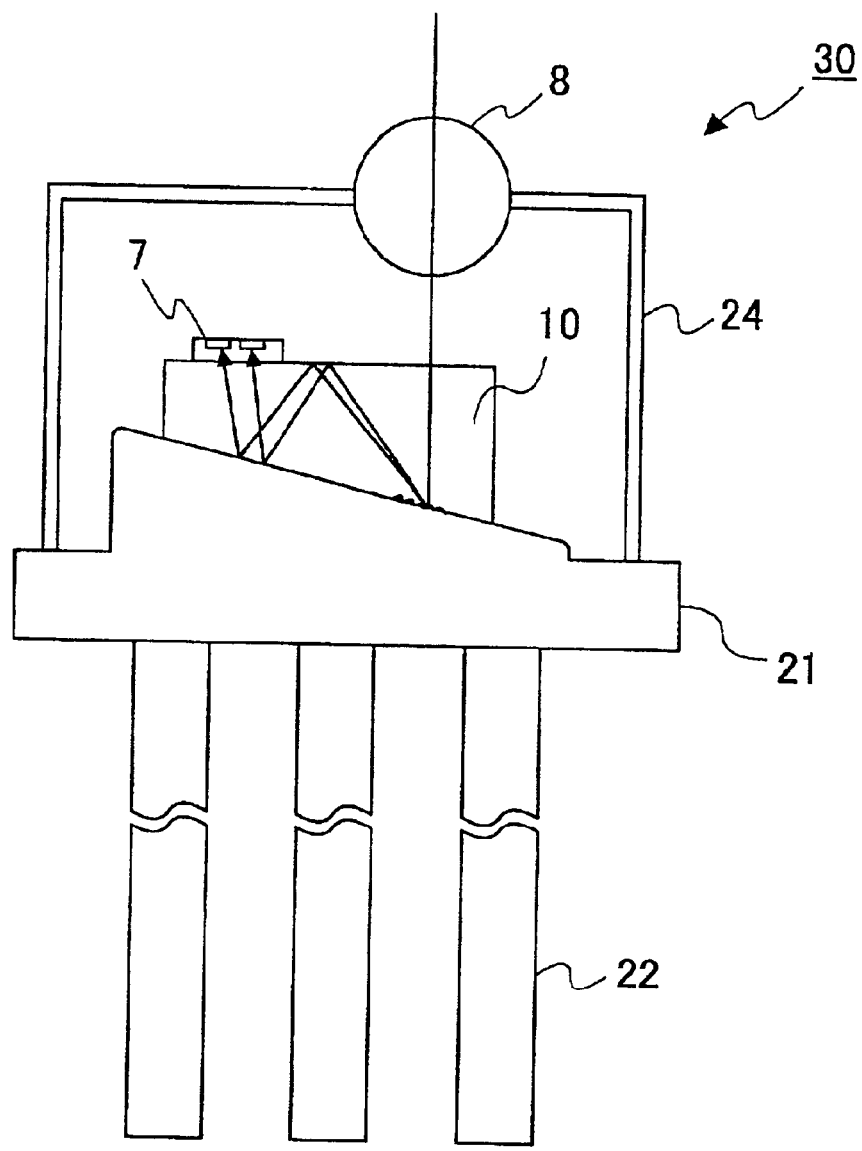
FIG. 8 is a diagram showing a PD package of the second embodiment of the present invention.

The structure of demultiplexing and receiving optical signals shown in FIG. 7 may be used for constructing a PD package by mounting the photoelectric transfer element 7 on the diffraction grating plate 10 as shown in FIG. 8. When constructing such a PD package, the diffraction grating plate may be provided with an electrode pattern (not shown) that is formed in advance and then electrically connected to the photoelectric transfer element 7.

Figure 9:
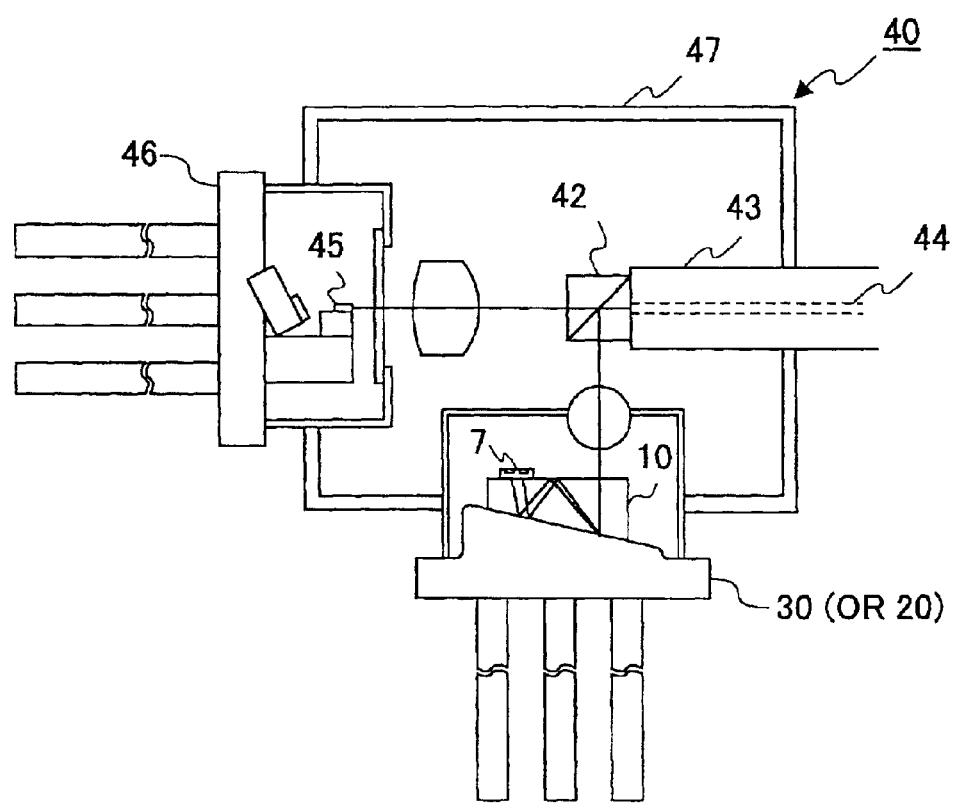
FIG. 9 is a diagram showing a wavelength-multiplexed bidirectional optical transmission module of the first embodiment of the present invention.

FIG. 9 is a diagram showing a wavelength multiplexing bidirectional optical transmission module of the present invention that includes the PD package described above.

A wavelength multiplexing/demultiplexing coupler 42 having a prism shape is provided for separating a proximate wavelength band (λ1, λ2, . . . ) containing the wavelength-multiplexed optical signal from another wavelength band (λ0) that is separate from the proximate wavelength band. The wavelength multiplexing/demultiplexing coupler 42 is securely attached to an end surface of a ferrule 43 with an optical fiber 44 provided therein.

The wavelength multiplexing/demultiplexing coupler 42 is arranged such that light beam of the proximate wavelength band is reflected in a direction perpendicular to the optical axis of the optical fiber 44 and the light beam of another wavelength band separate from the proximate wavelength band is transmitted in the direction of the optical axis of the optical fiber 44.

At a position along the optical axis of the fiber, an LD package 46 is arranged that accommodates an LD element 45 for emitting the light beams of other wavelength bands separate from the proximate wavelength band.

At a position along the direction perpendicular to the optical axis of the optical fiber 44, a PD package 30 (or 20) is arranged that is capable of receiving the wavelength-multiplexed signal. The above-described members are fixedly supported by a single housing member 47.

It is to be noted that a part of a peripheral surface near the tip of the ferrule may be cut off to form a notch.

The transmission light beam from the LD 45 passes directly through (in a straight direction) the multiplexing/demultiplexing coupler 42 along the optical axis and is transmitted through the optical fiber 44.

The wavelength-multiplexed optical signal ($\lambda 1, \lambda 2, \ldots$) arriving through the optical fiber 44 is reflected by the multiplexing/demultiplexing coupler 42 in a direction perpendicular to the optical axis of the optical fiber 44 and is incident on the PD package 30 (or 20).

The wavelength-multiplexed optical signal incident on the PD package 30 (or 20) is separated by the diffraction grating plate 10 and the resulting diffracted beams are received by the PD element 7.

Figure 10:
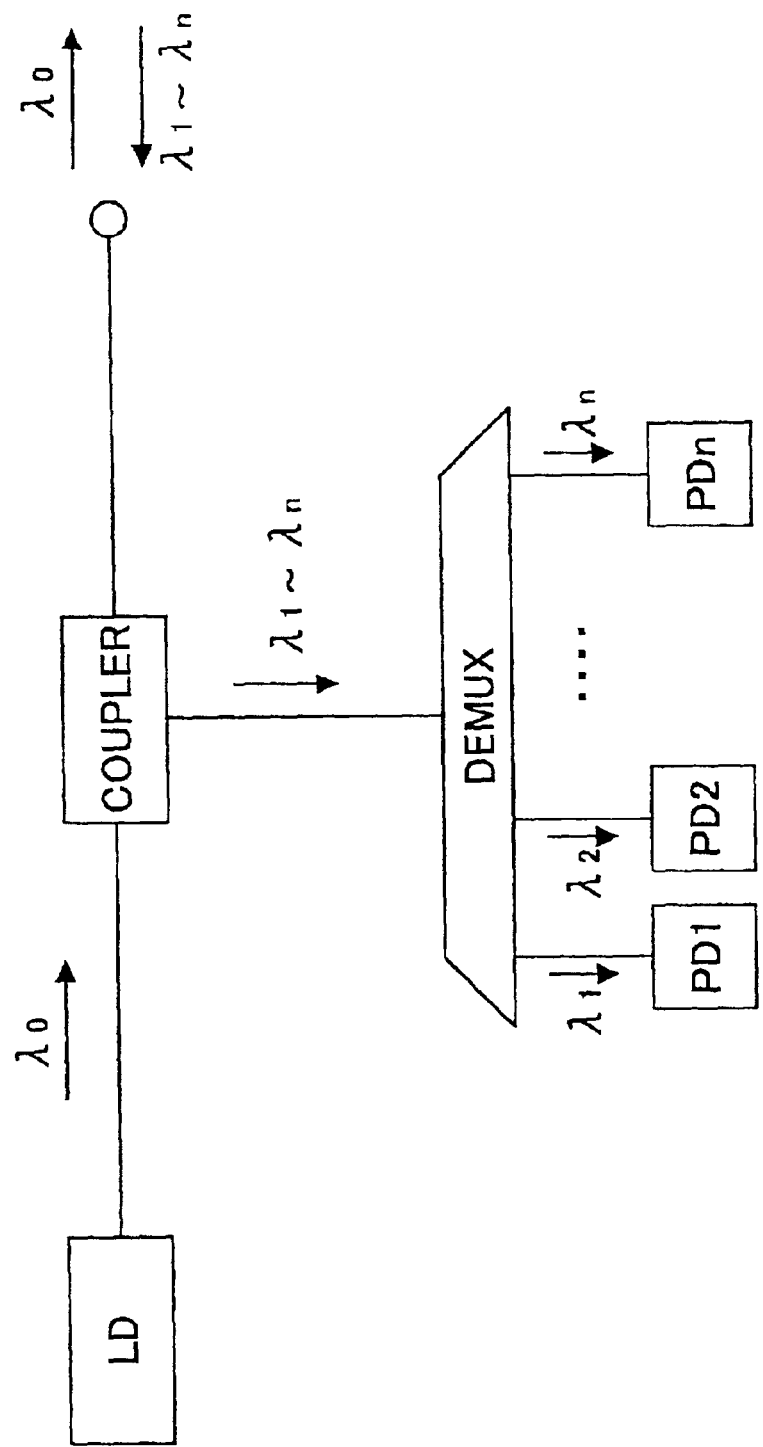
FIG. 10 is a functional block diagram of the wavelength-multiplexed bidirectional optical transmission module of the first embodiment of the present invention.

Accordingly, the wavelength-multiplexed bidirectional optical transmission module having functions illustrated in FIG. 10 can be achieved.

It is to be noted that, in FIG. 9, the multiplexing/demultiplexing coupler 42 may be selected such that the LD package and the PD package are placed at interchanged positions.

Figure 11:
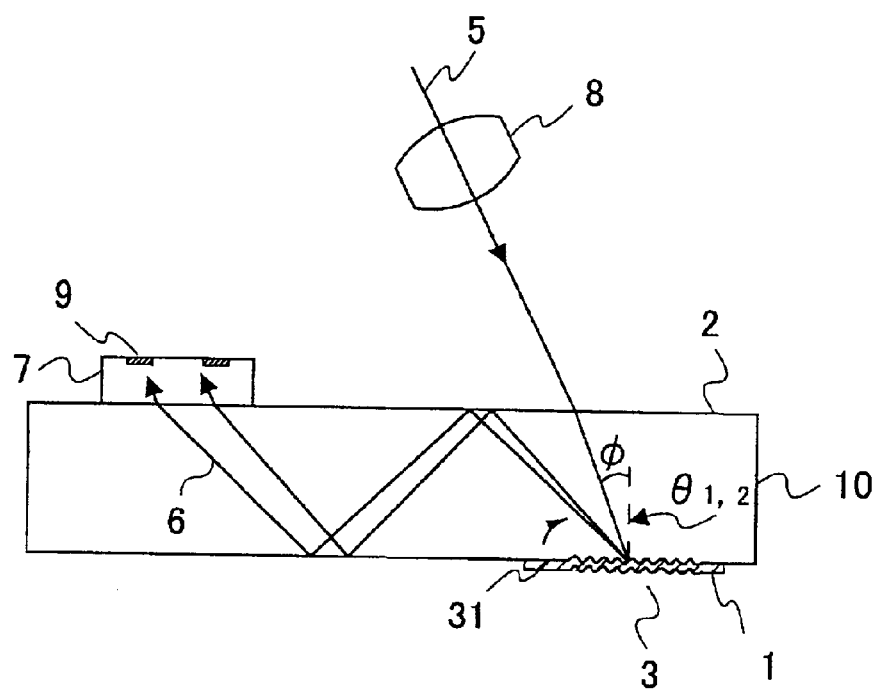
FIG. 11 is a diagram showing how a wavelength-multiplexed light beam is demultiplexed and received according to a third embodiment of the present invention.

FIG. 11 is a diagram showing a further structure in which a wavelength-multiplexed optical signal is demultiplexed and received according to the present invention.

The photoelectric transfer element 7 is mounted on the plate 10 and the diffracted light beams 6 reflected and transmitted through the plate are guided toward the receiving surface 9 through the substrate of the photoelectric transfer element 7.

The angle of diffraction $\theta$ is selected such that for each of the reflected beams of diffracted light beams at the first and second reflection surfaces, the total reflection condition according to Snell's law is satisfied. Thus, the total reflection film is dispensed with.

When the refractive index of the photoelectric transfer element 7 is selected as being greater than the refractive index of the plate 10, the total reflection condition is not satisfied at the photoelectric transfer element mounting part. Therefore, the diffracted light beams are retrieved at the photoelectric transfer element side and are guided toward the light receiving parts 9, respectively.

Figure 12:
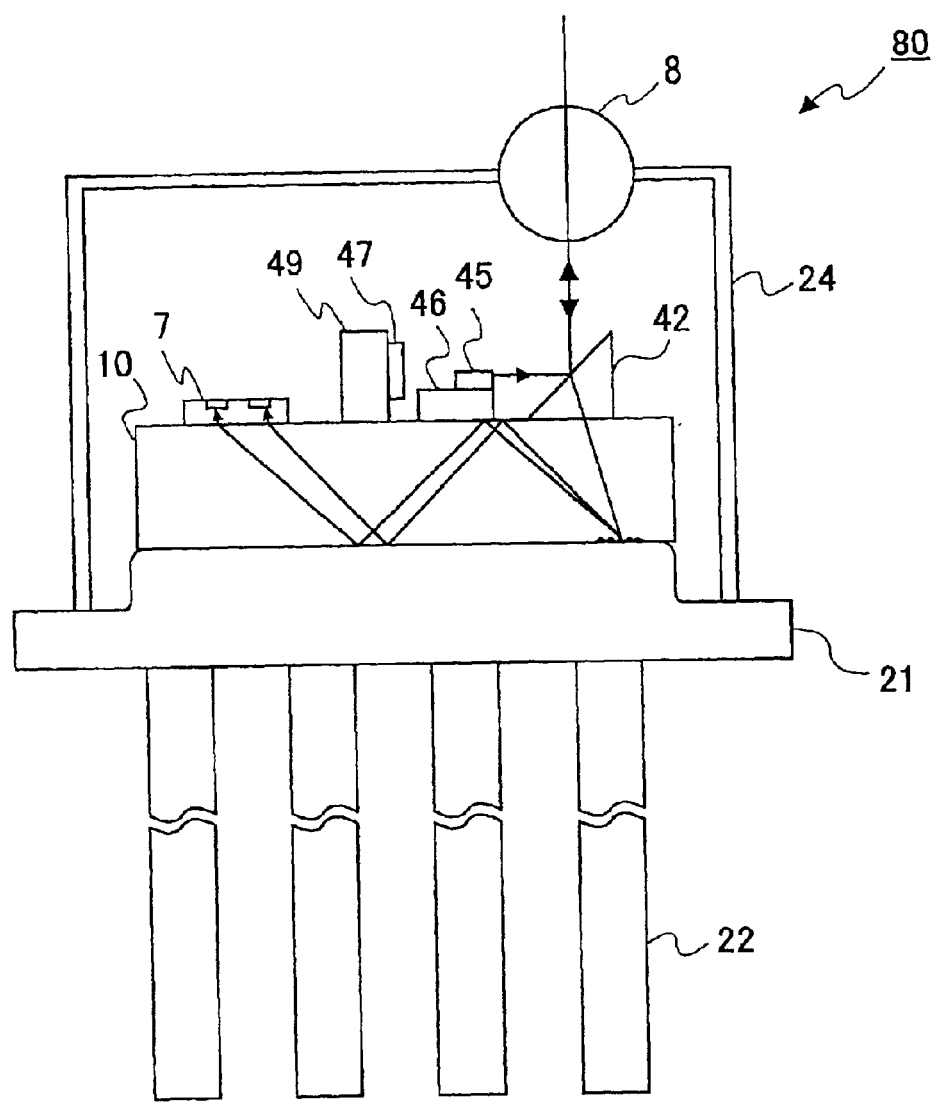
FIG. 12 is a diagram showing a LD/PD package of the first embodiment of the present invention.

FIG. 12 is a diagram showing an LD/PD package that is used as a means for mounting the structure for demultiplexeding and receiving optical signals that is shown in FIG. 11.

As shown in FIG. 12, a prism-shaped multiplexing/demultiplexing coupler 42, a PD element 7 for receiving a multiplexed optical signal of a proximate wavelength band and an LD 45 for emitting an optical signal of another wavelength band separate from the proximate wavelength band are mounted on the diffraction grating plate 10. The prism-shaped multiplexing/demultiplexing coupler 42 separates the proximate wavelength band from the other wavelength band separate from the proximate wavelength band. All of these elements constitute a subassembly.

In order to avoid stray light from the LD 45 being received on the PD 7 (cross talk), the diffraction grating plate 10 is preferably configured such that the PD element is not positioned along an extension of the direction of emission of the LD 45.

The subassembly is mounted at a predetermined position on the stem 21 having the electric lead terminals 22.

As shown in FIG. 12, the LD 45 may be mounted on the diffraction grating plate 10 via a heat sink 46. A monitor PD 47 may also be mounted on the diffraction grating plate 10.

It is also possible to form an electric pattern (not shown) on the diffraction grating plate 10 before assembly such that the above-mentioned LD 45, the PD 7 and the monitor PD 47 can be electrically connected thereto.

In order to take into account the heat dissipation from the LD 45, the diffraction grating plate 10 is preferably made of a semiconductor material such as silicon that has a high thermal conductivity.

The lens 8 is formed integral with a cap 24 of the stem 21 so that when the cap 24 is attached to the stem 21 to constitute an optical system, the photoelectric transfer element 7 is hermetically sealed with the cap 24.

Figure 13:
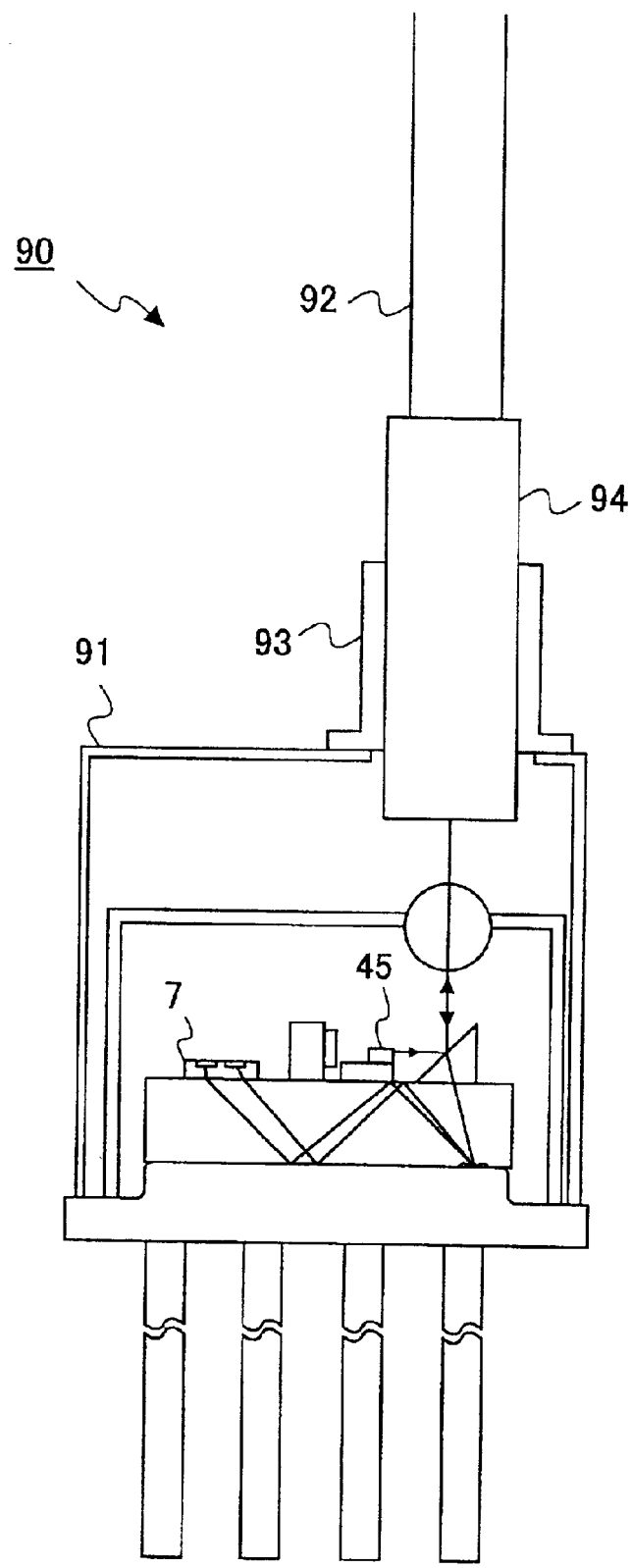
FIG. 13 is a diagram showing a wavelength-multiplexed bidirectional optical transmission module of the second embodiment of the present invention.

FIG. 13 is a diagram showing a wavelength multiplexing bidirectional optical transmission module of the present invention that includes the LD/PD package 80 described above.

A holder 91 is attached to the LD/PD package 80. Then, a ferrule-mounted optical fiber cable 92 is adjusted and attached at an appropriate position. Accordingly, a wavelength-multiplexing bidirectional optical transmission module having a function shown in FIG. 10 is obtained.

Figure 14:
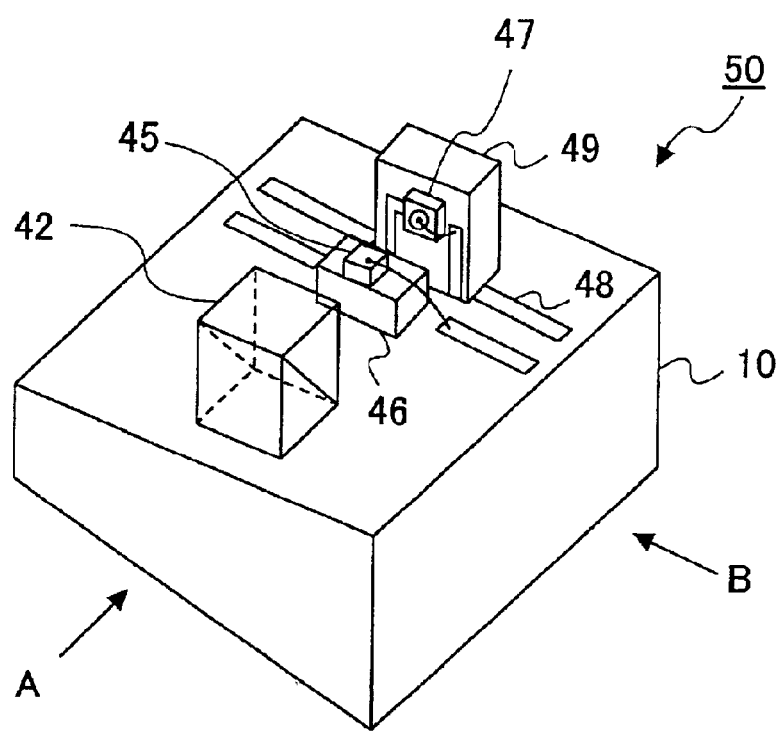
FIG. 14 is a diagram showing a subassembly of the first embodiment of the present invention.
Figure 15:
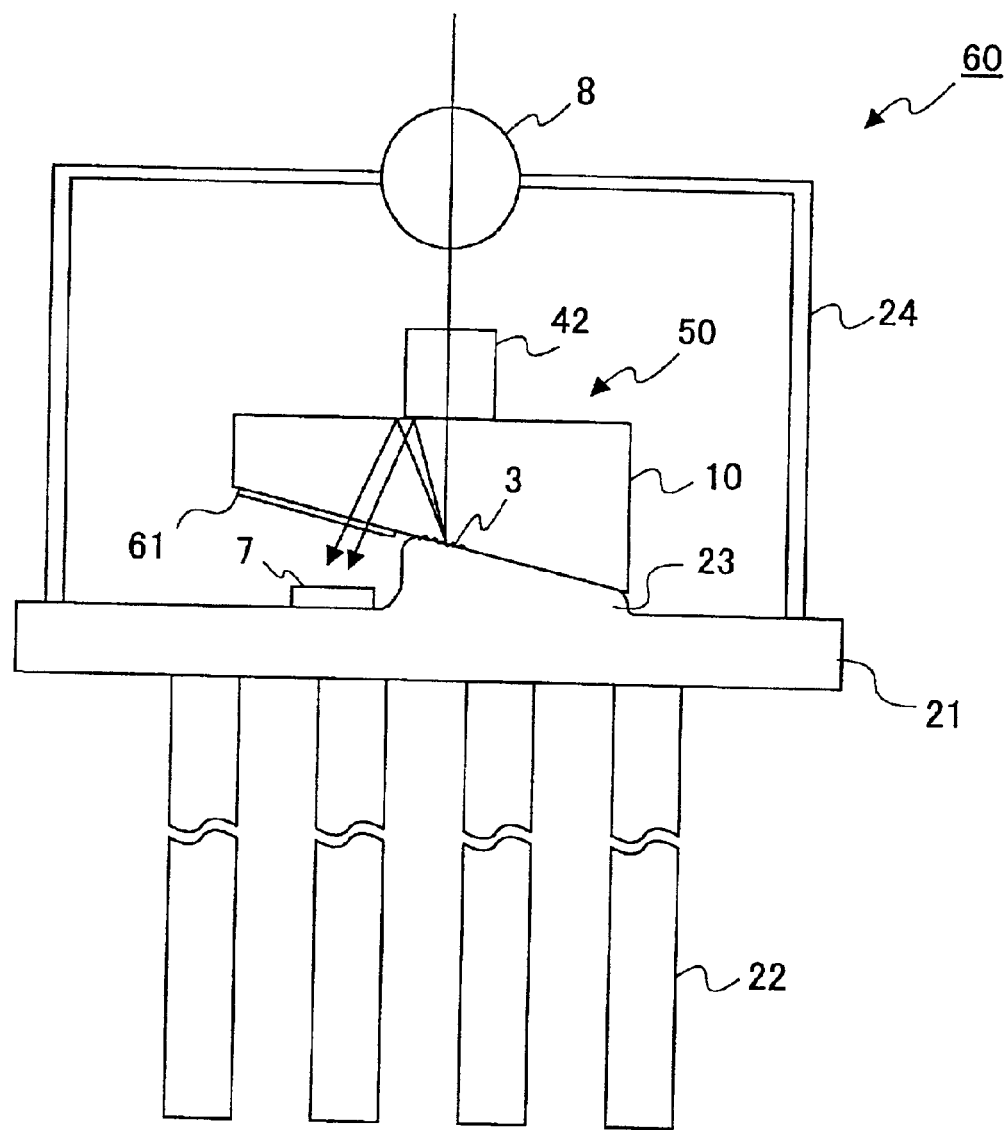
FIG. 15 is a diagram showing a LD/PD package of the second embodiment of the present invention.
Figure 16:
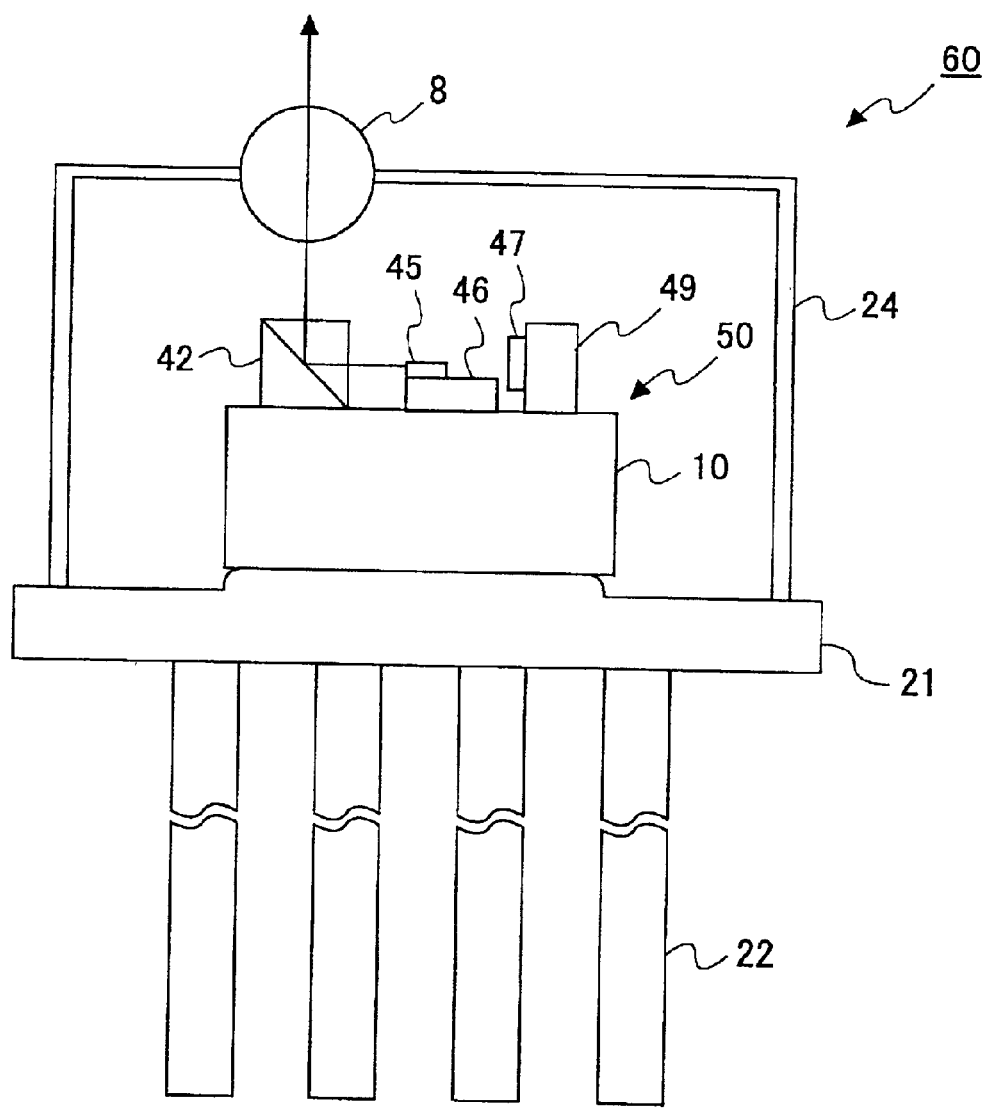
FIG. 16 is a diagram showing a LD/PD package of the third embodiment of the present invention.

FIGS. 14 through 16 are diagrams showing further mounting structures (PD/LD packages) of wavelength-multiplexing transmission modules.

As shown in FIG. 14, the prism-shaped multiplexing/demultiplexing coupler 42 and the LD 45 for emitting an optical signal of another wavelength band separate from the proximate wavelength band are mounted on the diffraction grating plate 10. The prism-shaped multiplexing/demultiplexing coupler 42 separates a proximate wavelength band from the other wavelength band separate from the proximate wavelength band. Such a structure constitutes a subassembly 50.

As can be seen in FIGS. 15 and 16 that show a LD/PD package 60, the subassembly 50 and the photoelectric transfer element (PD element) 7 for receiving a multiplexed optical signal of a proximate wavelength band are mounted on predetermined positions of the stem 21 having the electric lead terminals 22.

An angle between the reflection surfaces of the wedge-shaped plate 10 and a base 23 whereon the plate is mounted are configured such that the angle of incidence $\phi$ on the diffraction grating 3 is at a predetermined angle.

In order to avoid stray light from the LD 45 being received on the PD 7 (cross talk), a blocking film 61 for blocking the light beam from the LD 45 is preferably provided on the first or second reflection surface of the diffraction grating plate 10.

As shown in FIG. 14, the LD 45 may be mounted on the diffraction grating plate 10 via a heat sink 46. The monitor PD 47 may also be mounted on the diffraction grating plate 10.

It is also possible to form an electric pattern 48 on the diffraction grating plate 10 before assembly such that the above-mentioned LD 45 and the monitor PD 47 can be electrically connected thereto.

In order to take into account the heat dissipation from the LD 45, the diffraction grating plate 10 is preferably made of a semiconductor material such as silicon that has a high thermal conductivity.

The lens 8 is formed integral with a cap 24 of the stem 21 so that when the cap 24 is attached to the stem 21 to constitute an optical system, the photoelectric transfer element 7 is hermetically sealed with the cap 24

Figure 17:
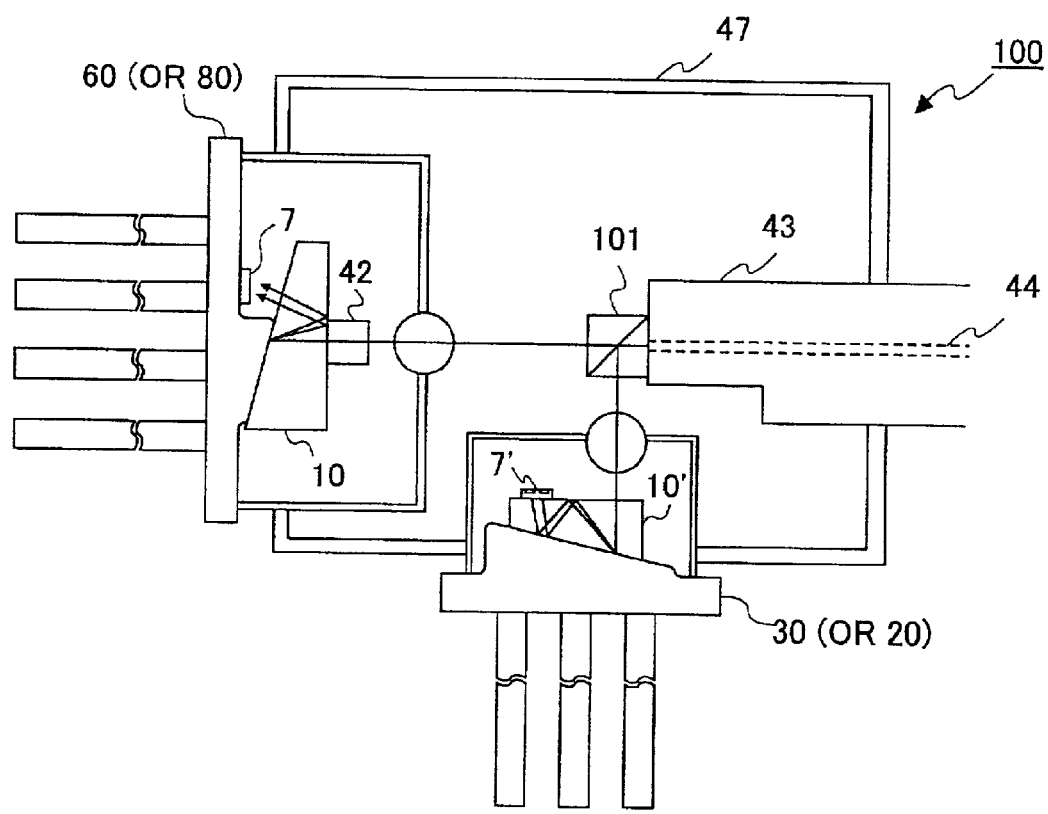
FIG. 17 is a diagram showing a wavelength-multiplexed bidirectional optical transmission module of the third embodiment of the present invention.

FIG. 17 is a diagram showing a wavelength multiplexing bidirectional optical transmission module of the present invention that includes the LD/PD package 60 described above.

A wavelength multiplexing/demultiplexing coupler 101 having a prism shape is provided for separating a proximate wavelength band that includes wavelength-multiplexed optical signals into a first proximate wavelength band ($\lambda 1$, $\lambda 2$, ... ) and a second proximate wavelength band ($\lambda 1'$, $\lambda 2'$, ... ). The wavelength multiplexing/demultiplexing coupler 101 is securely attached to an end surface of a ferrule 43 with an optical fiber 44 provided therein.

The prism coupler 101 is arranged such that the light beam of the first proximate wavelength band is transmitted in a direction of the optical axis of the optical fiber 44 and the light beam of the second proximate wavelength band is transmitted in a direction perpendicular to the direction of the optical axis of the optical fiber 44.

Further, the prism coupler 101 is designed to transmit the light beam of another wavelength band ($\lambda 0$) that is separate from the proximate wavelength band in a direction of the optical axis of the optical fiber 44.

The LD/PD package 60 shown in FIGS. 14 through 16 is positioned along the optical axis and the PD package 30 shown in FIGS. 8 and 9 is positioned along a direction perpendicular to the optical axis. The LD/PD package 60 and the PD package 30 are securely supported by a single housing member 47.

The wavelength multiplexed optical signals ($\lambda 1, \lambda 2, \ldots$, $\lambda 1', \lambda 2', \ldots$) are separated by the wavelength multiplexing/demultiplexing coupler 101. The first proximate wavelength band ($\lambda 1, \lambda 2, \ldots$) is transmitted in the direction of the optical axis of the optical fiber 44 and is incident on the LD/PD package 60. The second proximate wavelength band ($\lambda 1', \lambda 2', \ldots$) is reflected in a direction perpendicular to the optical axis of the optical fiber 44 and is incident on the PD package 30 (or 20).

The multiplexed optical signal of the first proximate wavelength band that is incident on the LD/PD package 60 is separated by a first diffraction grating plate 10 and is received by a first PD array element 7.

The multiplexed optical signal of the second proximate wavelength band that is incident on the PD package 30 is separated by a second diffraction grating plate 10' and is received by a second PD array element 7'.

The light beam $\lambda 0$ emitted from the LD (not shown. See FIG. 16 for details) mounted in the LD/PD package 60 passes directly through (in a straight direction) the multiplexing/demultiplexing coupler 101 along the optical axis and is transmitted through the optical fiber 44.

Figure 18:
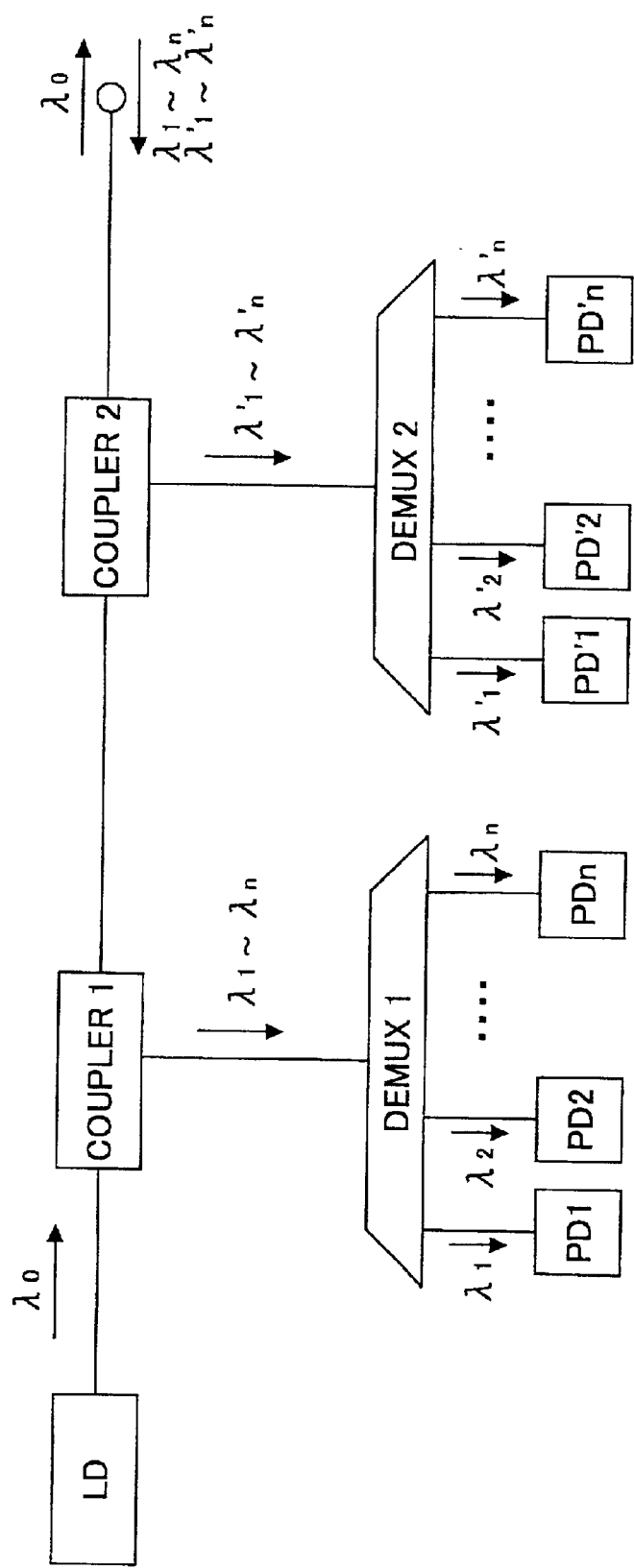
FIG. 18 is a functional block diagram of the wavelength-multiplexed bidirectional optical transmission module of the second embodiment of the present invention.

Accordingly, a wavelength multiplexing bidirectional optical transmission module having functions shown in FIG. 18 is obtained.

It is to be noted that, in FIG. 17, the multiplexing/demultiplexing coupler 101 may be selected such that the LD package and the PD package are placed at interchanged positions.

It is to be noted that for all of the embodiments described above, the photoelectric transfer element for receiving the multiplexed optical signal of a proximate wavelength band may be formed as an array having individual receiving surfaces for each signal of the separated wavelengths.

According to the present invention, as shown in FIG. 5, the wavelength multiplexed signal 5 is diffracted by the diffraction grating 3 and each of the optical signals 6 emitted at a different angle of diffraction for each wavelength is propagated by being reflected for a plurality of times between two reflection surfaces. Therefore, an increased spatial separation distance between optical signals can be achieved with a compact structure and the separated optical signals 6 can be retrieved from a single direction.

Figure 1:
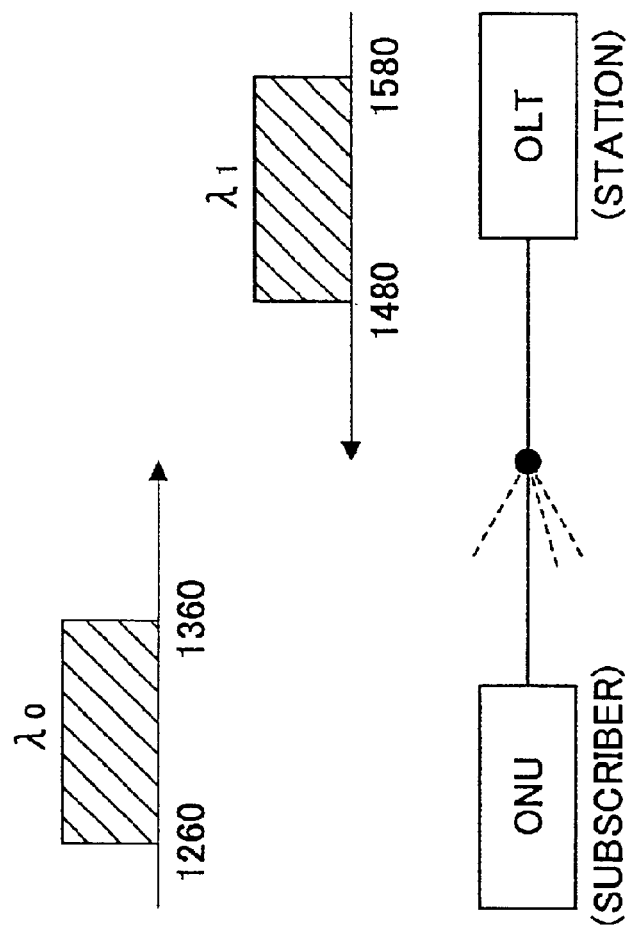
FIG. 1 is a diagram showing a communication system of the related art.
Figure 2:
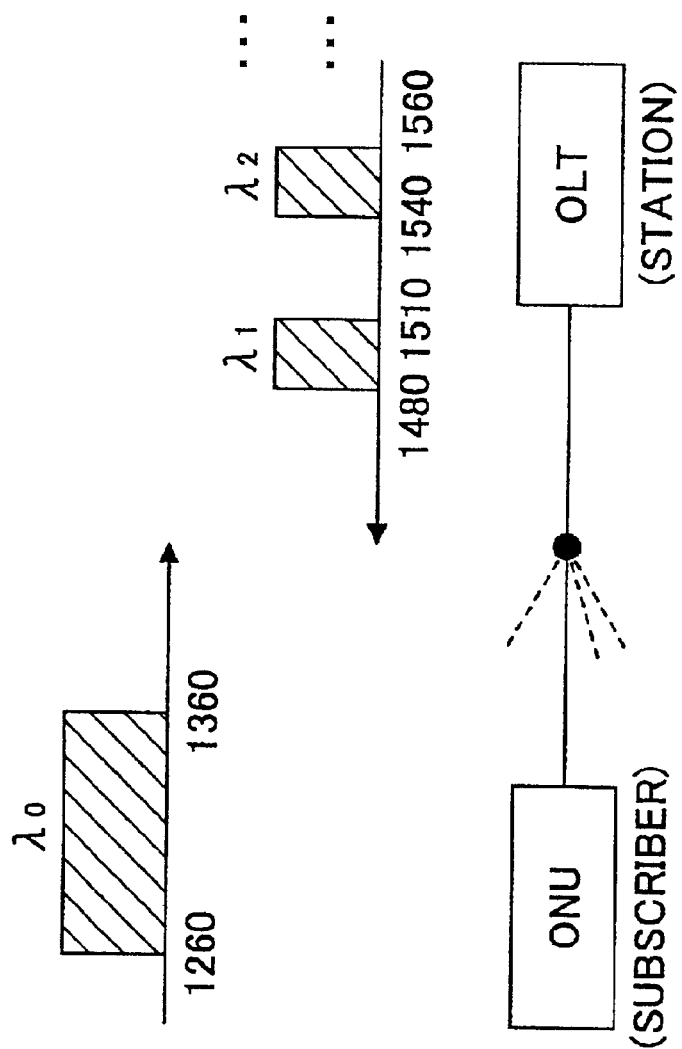
FIG. 2 is a diagram showing a communication system in which the present invention is applicable.
Figure 3:
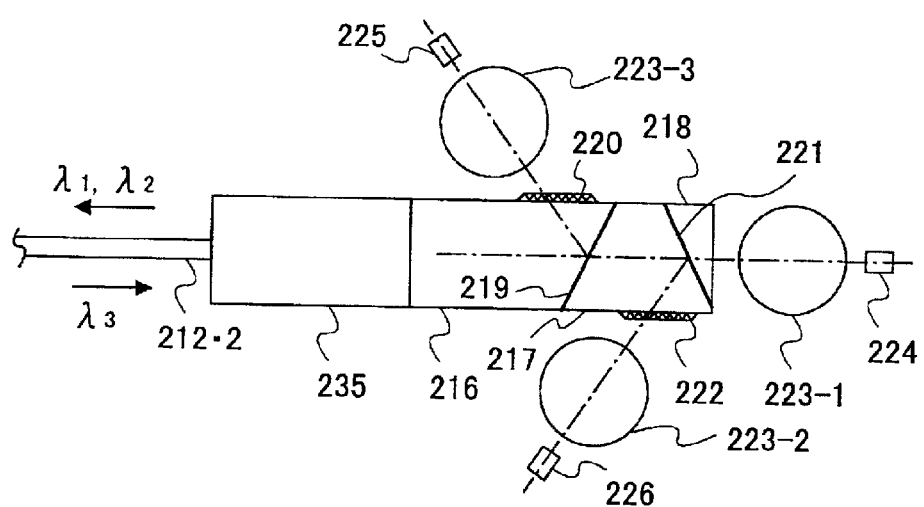
FIG. 3 is a diagram showing a first example of an optical module of the related art.
Figure 4:
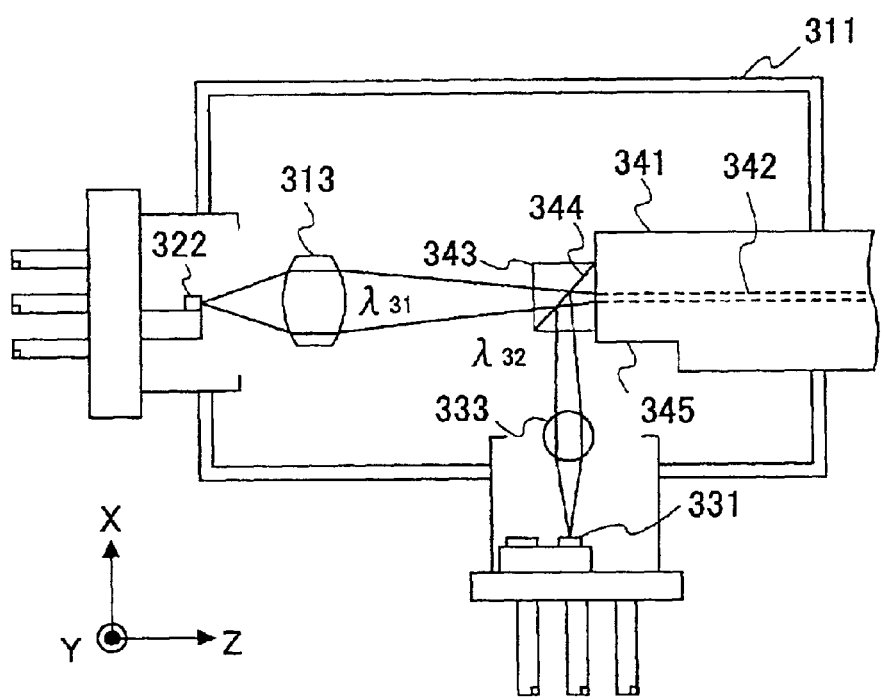
FIG. 4 is a diagram showing a second example of an optical module of the related art.

Accordingly, the direction of separation of each optical signal will not be dispersed in a plurality of directions as in Example 1 (FIG. 3) of the related art. Thus, there is an advantage that the module can be constructed with a simple structure.

Also, regardless of the number of multiplexed wavelengths, the present invention simply requires reflection surfaces opposing each other, each having a reflectivity of 100%, and a diffraction grating of a single type at a part of the reflection surfaces.

Accordingly, the present invention can be provided at a reduced cost as compared to the structure of Example 1 of the related art in which dielectric multilayered films of different characteristics are required with the number of dielectric multilayered films being greater than the number of multiplexed wavelengths.

When glass is selected as the material of the diffraction grating plate, two surfaces of high flatness can be readily made at any desired wedge angle with high accuracy. Accordingly, improved productivity and a reduced cost can be achieved.

Further, if the diffracted light beam in the diffraction grating plate is propagated under the total reflection condition, there is no need to form reflection films on reflection surfaces of the diffraction grating plate.

With a wedge-shaped diffraction grating plate, the reflection propagating period of the diffracted light beam can be decreased gradually. Therefore, the wedge-shaped diffraction grating plate can be formed with a reduced length as compared to a flat diffraction grating plate with parallel reflection surfaces.

Even when the diffracted light beam reflected and propagated through the plate is emitted at an angle that satisfies the total reflection condition (no reflection films required), with the wedge-shaped plate, a condition that does not satisfy the total reflection condition can be obtained during propagation and the diffracted light beam can be taken out of the plate (into the air).

With the photoelectric transfer element being mounted on the diffraction grating plate and an electrode pattern for electrical conduction to the photoelectric transfer element formed on the diffraction grating plate, a carrier for the photoelectric transfer element required in the related art is no longer necessary. Accordingly, the number of components can be reduced and thus an integrated compact structure can be achieved.

When the refractive indexes of the photoelectric transfer element mounted on the diffraction grating plate and the mounting adhesive agent are selected with values greater than the refractive index of the diffraction grating plate, even if the diffracted light beam propagated through the plate is reflected and propagated under the total reflection condition, the total reflection condition is not satisfied at the photoelectric transfer element mounting part. Therefore, the diffracted light beam can be guided toward the photoelectric transfer element.

The above-mentioned diffraction grating plate alone is capable of demultiplexing a plurality of multiplexed signals.

When the corresponding receiver PDs are also formed as an array, the PD element can be formed as a compact structure and thus a demultiplexing/receiving function can be accommodated in a compact package. It is also possible to provide a hermetically sealed package using a stem with electric lead terminals and a lens cap that are used for commercially available LD or PD packages.

In other words, the wavelength multiplexing bidirectional optical transmission module of the present invention can be readily achieved using a conventional module technique.

The function shown in FIG. 10 can be readily achieved by a conventional assembly technique. In other words, for the wavelength multiplexing/demultiplexing coupler for separating a wavelength-multiplexed optical signal of a proximate wavelength band and other wavelength band (λ0) that is separate from the proximate wavelength band, the multiple wavelength receiver PD package (see FIGS. 6 and 8) in which the diffraction grating plate is accommodated and the LD package provided with the photoelectric transfer element (LD) of wavelength λ0 provided therein are assembled using the conventional assembly technique.

Similarly, the functions illustrated in FIGS. 10 and 18 can be readily obtained using the LD/PD package whereon the diffraction grating plate, the receiver PD element, the transmitter LD element and the wavelength multiplexing/demultiplexing prism coupler are integrated.

The above-mentioned LD/PD package may be structured such that the transmitter LD element and the receiver PD element are positioned at mutually opposite positions of the diffraction grating plate. Then, a film for blocking light of a light-emitting wavelength of the transmitter LD is provided on the diffraction grating plate to reduce cross talk from the transmitter LD to the receiver PD.

Accordingly, the present invention provides a wavelength multiplexing bidirectional optical transmission module that can obviate the problems of the related art and can readily provide a sophisticated module using a fabrication method of the related art. Further, the present invention provides a compact and low cost wavelength multiplexing bidirectional optical transmission module.

Referring to FIG. 5, a structure of the first embodiment is shown in which a wavelength-multiplexed optical signal is diffracted and received according to the present invention.

The first and second reflection surfaces are selected as two surfaces of the wedge-shaped plate 10 made of glass. The diffraction grating 3 for separating the wavelength multiplexed light beam 5 is formed on a part of the first reflection surface 1.

The diffraction grating can be made by a conventional pattern forming technique based on interference exposure and a conventional groove forming technique using a RIE (reactive ion etching) process.

Thereafter, the metal film 31 is formed. Note that the metal film is not formed on the retrieving window 12. A metal layer 32 is formed on the second reflection surface 2 except on the transparent window 11 through which the wavelength multiplexed optical signal passes into the plate 10 so as to be incident on the diffraction grating 3. The metal film may be a film with stacked layers of, for example, titanium (Ti) and gold (Au).

With such a structure, the wavelength multiplexed optical signal 5 is transmitted through the transparent window 11 and is incident on the diffraction grating 3 at an angle φ in a glass medium and produces diffracted light beams, at different angle, for example θ1 and θ2, for each wavelength.

For a two-wave multiplexed optical signal (λ=1490 nm, 1550 nm), parameters concerning the diffraction grating and the wedge-shaped plate are, for example, set at values as follows:

Number of grooves of diffraction grating: N=800/nm
Angle of incidence of wavelength-multiplexed light (in glass medium): φ=14

Angle of diffraction of wavelength 1490 nm (in glass medium): θ1=33.6° (m=1)
Angle of diffraction of wavelength 1550 nm (in glass medium): θ2=35.8° (m=1)
Wedge angle of wedge-shaped plate: 14
Thickness of plate at position of incident of multiplex reflection light: t=2 mm With the above conditions, when the optical signal is reflected once at the second reflection surface and emitted out of the retrieving window 12 as shown in FIG. 5, a spatial separation of about 300 μm between the optical signal of wavelength 1490 nm and the optical signal of wavelength 1550 nm can be achieved.

The photoelectric transfer element (PD element) 7 may be arranged at a position corresponding to the spatially separated optical signals to demultiplex and receive multiplexed optical signals. The lens 8 is used for collecting optical signals on the receiving surfaces 9, respectively, of the PD element 9. Accordingly, reception cross talk between neighboring signals can be reduced.

In the example described above, glass is selected as the material of the wedge-shaped plate. However, any material such as silicon and Indium-phosphor that is transparent to the wavelength multiplexed optical signal may be selected.

Further, the reflection films 31 and 32 may be a dielectric multilayered film. In such a case, reflectivity is set to 100%.

Preferably, a reflection free treatment is applied on the transmission window 11 and the retrieving window 12 for the wavelength band of the wavelength-multiplexed signal.

FIG. 6 is an example of the PD package whereon the structure of FIG. 5 is mounted. The PD package includes a stem 21 having electric lead terminals 22. The photoelectric transfer element 7 and the diffraction grating plate 10 are mounted at predetermined positions on the stem 21. For example, an epoxy adhesive material is used as an adhesive.

The base 23 for the wedge-shaped plate formed on the stem is configured such that the angle of incidence φ (FIG. 5) on the diffraction grating is at a predetermined angle.

The lens 8 is formed integral with a cap 24 of the stem so that when the cap 24 is attached to the stem 21 to constitute an optical system, the photoelectric transfer element 7 is hermetically sealed with the cap 24.

The PD package is designed such that the lens is provided at a position where diffracted rays are collected on the light-receiving surfaces 9 of the photoelectric transfer element 7.

Referring to FIG. 7, a structure of a second embodiment is shown in which a wavelength-multiplexed optical signal is demultiplexed and received according to the present invention.

First and second reflection surfaces are selected as two surfaces of the wedge-shaped plate 10 made of TaF glass (refractive index 1.8). The diffraction grating 3 is formed on a part of the first reflection surface 1 and the metal film 31 is formed thereon.

A reflective film is not formed on the second surface. For a two-wave multiplexed optical signal (λ=1490 nm, 1550 nm), in order that at least the first reflection of the diffracted light satisfies the total reflection condition according to Snell's law, parameters concerning the diffraction grating and the wedge-shaped plate are, for example, set at values as follows:

Number of grooves of diffraction grating: N=1000/nm
Angle of incidence of wavelength-multiplexed light (in glass medium): φ=14
Angle of diffraction of wavelength 1490 nm (in glass medium): θ1=48.8° (m=1)

Angle of diffraction of wavelength 1550 nm (in glass medium): $\theta2=52.4°$ (m=1)

Wedge angle of wedge-shaped plate: 14

Thickness of plate at position of incident of multiplexed reflection light: t=2 mm With the above conditions, the first reflection on the second surface of the diffracted light produced at the diffraction grating satisfies the total reflection condition.

Thereafter, since the plate is wedge-shaped, the total reflection condition of the diffracted light is no longer satisfied. Therefore, after the diffracted light is reflected on the reflection film of the first reflection surface, a spatially separated light is emitted through the second reflection surface.

Accordingly, a spatial separation of about 250 µm between the optical signal of wavelength 1490 nm and the optical signal of wavelength 1550 nm can be achieved.

The photoelectric transfer element (PD element) 7 may be arranged at a position corresponding to the spatially separated optical signals to demultiplex and receive multiplexed optical signals. The lens 8 is used for collecting optical signals on the receiving surfaces 9 of the PD element 7. Accordingly, reception cross talk between neighboring signals can be reduced.

FIG. 8 is an example of the PD package whereon the structure of FIG. 7 is mounted. As shown in FIG. 8, the photoelectric transfer element 7 can be mounted on the diffraction grating plate 10. For example, an epoxy adhesive material is used as an adhesive for fixing the photoelectric transfer element 7.

It is also possible to form electrode patterns (not shown) on the diffraction grating plate 10 in advance and then electrically connect the electrode patterns and the photoelectric transfer element 7 using Au wires.

FIG. 9 is a diagram showing a wavelength multiplexing bidirectional optical transmission module 40 of the present invention that includes the PD package shown in FIG. 6 or FIG. 8.

The module 40 is basically a structure including the PD package 30 (or 20) for receiving the wavelength multiplexed signal, the LD package 46 serving as an optical transmitter part and a fiber assembly with ferrule that is provided with the wavelength multiplexing/demultiplexing coupler 42, all of which are fixedly supported by a single housing member 47.

The wavelength multiplexing/demultiplexing coupler 42 is a prism shaped coupler provided with a film for multiplexing and demultiplexing the wavelength multiplexed optical signal (e.g., $\lambda1=1490$ nm, $\lambda2=1550$ nm) that is a reception signal and another wavelength band (transmission signal; e.g., $\lambda0=1310$ nm) that is separate from the reception signal. The wavelength multiplexing/demultiplexing coupler 42 may have a cubic shape with length of the side being 1 mm.

The wavelength multiplexing/demultiplexing coupler 42 is directly fixed on the end surface of the ferrule 43 along the optical axis using an adhesive agent.

The wavelength multiplexing/demultiplexing coupler 42 is arranged such that the reception signal is reflected in a direction perpendicular to the optical axis of the optical fiber 44 and the transmission signal is transmitted in the direction of the optical axis of the optical fiber 44.

The LD package 46 is arranged at a position along the optical axis of the optical fiber 44 and the PD package 30 (or 20) is arranged at a position along the direction perpendicular to the optical axis of the optical fiber 44. Then, after adjusting the optical axis to an optimum position, the LD package 46 and the PD package 30 are fixed by laser welding.

The transmission light beam ($\lambda0=1310$ nm) from the LD 45 directly passes through (in a straight direction) the multiplexing/demultiplexing coupler 42 along the optical axis and is transmitted through the optical fiber 44.

The wavelength-multiplexed optical signal ($\lambda1=1490$ nm, $\lambda2=1550$ nm) arriving through the optical fiber 44 is reflected by the multiplexing/demultiplexing coupler 42 in a direction perpendicular to the optical axis of the optical fiber 44 and is incident on the PD package 30 (or 20).

The wavelength-multiplexed optical signal incident on the PD package 30 is separated by the diffraction grating plate 10 and is received by the PD element 7.

Accordingly, the wavelength-multiplexed bidirectional optical transmission module having functions illustrated in FIG. 10 can be achieved.

Referring to FIG. 11, a structure of the third embodiment is shown in which a wavelength-multiplexed optical signal is demultiplexed and received according to the present invention.

First and second reflection surfaces are selected as two surfaces of the flat plate 10 made of glass. The diffraction grating 3 is formed on a part of the first reflection surface 1 and the metal film 31 is formed thereon.

Parameters concerning the diffraction grating are selected such that reflection of the diffracted light at the first and second reflection surfaces satisfies the total reflection condition according to Snell's law. For example, for a two-wave multiplexed optical signal ($\lambda=1490$ nm, 1550 nm), the parameters are set at values as follows:

Number of grooves of diffraction grating: N=1000/nm

Angle of incidence of wavelength-multiplexed light (in air): $\phi=28$

Angle of incidence of wavelength-multiplexed light (in glass medium): $\phi=18$

Angle of diffraction of wavelength 1490 nm (in glass medium): $\theta1=42.9°$ (m=1)

Angle of diffraction of wavelength 1550 nm (in glass medium): $\theta2=46.1°$ (m=1)

Thickness of plate at position of incident of multiplexed reflection light: t=1.5 mm With the above conditions, the diffracted light propagates through the plate under the total reflection condition. Therefore, there is no need to form a total reflection film except at the diffraction grating portion.

The photoelectric transfer element (PD element 7) is fixedly attached to the flat plate 10 using, for example, an optically transparent adhesive material (not shown).

The PD element 7 and the adhesive agent are selected from materials having refractive index greater than the refractive index of glass forming the flat plate 10.

For example, for the flat plate made of glass (refractive index 1.5), the PD element 7 may be made of Indium-phosphor (refractive index 3.4) and the adhesive agent may be made of transparent epoxy (refractive index 1.65). Accordingly, the total reflection condition is not satisfied at the PD element mounting part. Therefore, the diffracted light beam can be retrieved on the PD element side and can be guided toward the light-receiving surfaces 9.

FIG. 12 is a diagram showing another embodiment (LD/PD package) of wavelength multiplexing bidirectional transmission using structure of FIG. 11.

As shown in FIG. 12, for the prism shaped wavelength multiplexing/demultiplexing coupler 42 for multiplexing and demultiplexing the wavelength multiplexed optical signal (e.g., $\lambda1=1490$ nm, $\lambda2=1550$ nm) that is a reception signal and another wavelength band (transmission signal;

e.g., λ0=1310 nm) that is separate from the reception signal, the receiver PD element 7, the transmitter LD element 45 (e.g., λ0=1310 nm) and the monitor PD element 47 are mounted on the flat diffraction grating plate 10 equivalent to the plate shown in FIG. 11.

The wavelength multiplexing/demultiplexing coupler 42 is arranged such that an optical path of the transmission light from the LD 45 is redirected in an upward direction.

The LD element 45 and the monitor PD element 47 are arranged on the diffraction grating plate via the heat sink 46 and the subcarrier 49, respectively. Each optical element (LD 45, PD 7 and monitor PD 47) is electrically connected to the electrode pattern (not shown) on the diffraction grating plate 10 via, for example, Au wires.

The diffraction grating plate 10 mounted with the optical elements is mounted at a predetermined position on the stem 21 having electric leads 22.

The lens 8 is formed integral with a cap 24 of the stem 21 so that when the cap 24 is projection-welded on the stem 21 to constitute an optical system, the photoelectric transfer element 7 is hermetically sealed with the cap 24.

The LD/PD package is designed such that the lens 8 is provided at a position where at least diffracted rays produced in the diffraction grating plate 10 are collected on the light-receiving surfaces of the photoelectric transfer element 7. With such a structure, the light (e.g., λ=1310 nm) emitted from the LD 45 is reflected by the wavelength multiplexing/demultiplexing coupler 42 and is redirected in an upward direction. Then the light collected by the lens 8 is projected to an optical fiber (not shown).

Also, the wavelength multiplexed signal (e.g., λ1=1490 nm, λ2=1550 nm) that is incident via the lens 8 is separated by the diffraction grating plate and is received by the PD element 7.

FIG. 13 is a diagram showing a wavelength multiplexing bidirectional optical transmission module of the present invention that includes the LD/PD package described above. The holder 91 is attached to the LD/PD package 80 by projection-welding. Then, the ferrule-mounted optical fiber cable 92 is arranged on the holder 91 through a sleeve 93.

The position of the ferrule 94 is adjusted to an optimum position where transmission light power of the LD 45 (e.g., λ0=1310 nm) and light-receiving sensitivities of the PD 7 for the wavelength-multiplexed signal (e.g., λ1=1490 nm, λ2=1550 nm) are both maximum. At such an optimum position, the holder 91 and the ferrule 94 are laser-welded via the sleeve 93.

Accordingly, a wavelength-multiplexing bidirectional optical transmission module (FIG. 10) having a function (FIG. 10) equivalent to the module of FIG. 9 can be obtained as a more compact module.

FIGS. 14 through 16 are diagrams showing further mounting structures (PD/LD packages) of wavelength-multiplexing transmission modules.

As shown in FIG. 14, for the prism shaped wavelength multiplexing/demultiplexing coupler 42 for multiplexing and demultiplexing the wavelength multiplexed optical signal (e.g., λ1=1490 nm, λ2=1550 nm) that is a reception signal and another wavelength band (transmission signal; e.g., λ0=1310 nm) that is separate from the reception signal, the transmitter LD element 45 (e.g., λ0=1310 nm) and the monitor PD element 47 are mounted on the wedge-shaped diffraction grating plate 10 equivalent to the plate shown in FIG. 5.

The wavelength multiplexing/demultiplexing coupler 42 is arranged such that an optical path of the transmission light from the LD element 45 is redirected in an upward direction.

The LD element 45 and the monitor PD element 47 are arranged on the diffraction grating plate via the heat sink 46 and the subcarrier 49, respectively. Each optical element (LD 45 and monitor PD 47) is electrically connected to the electrode pattern 48 on the diffraction grating plate 10 via, for example, Au wires.

In a similar manner to the PD package shown in FIG. 6, the diffraction grating plate 10 and the photoelectric transfer element 7 are mounted at predetermined positions on the stem 21 having the electric lead terminals 22.

The base 23 for the wedge-shaped plate formed on the stem is configured such that the angle of incidence φ on the diffraction grating 3 is at a predetermined angle.

The lens 8 is formed integral with a cap 24 of the stem so that when the cap 24 is projection-welded on the stem 21 to constitute an optical system, the photoelectric transfer element 7 is hermetically sealed with the cap 24. The LD/PD package is designed such that the lens is provided at a position where at least diffracted rays produced in the diffraction grating plate 10 are collected on the light-receiving surface of the photoelectric transfer element.

FIG. 15 is a cross-sectional diagram of the LD/PD package viewed in the direction A of FIG. 14. This is the same structure as FIG. 8 and the wavelength-multiplexed signal (e.g., λ1=1490 nm, λ2=1550 nm) incident through the lens 8 can be received.

FIG. 16 is a cross-sectional diagram of the LD/PD package viewed in the direction B of FIG. 14. FIG. 16 is used for explaining the transmitter part.

The light (e.g., λ=1310 nm) emitted from the LD 45 is reflected by the wavelength multiplexing/demultiplexing coupler 42 and is redirected in an upward direction. Then the light collected by the lens 8 is projected to an optical fiber (not shown)

In order to avoid receiving stray light from the LD 45 mounted on the diffraction grating plate 10 by the PD element 7 (cross talk), an LWPF (Long Wavelength Pass Filter) 61 is provided on the first reflection surface side of the diffraction grating plate 10 as shown in FIG. 15.

In order to take into account the heat dissipation from the LD 45, the diffraction grating plate 10 may be made of a semiconductor material such as silicon that has a high thermal conductivity.

FIG. 17 is a diagram showing an embodiment of the module using the LD/PD packages shown in FIGS. 14 through 16.

The module is basically a structure including the PD package 30 (or 20) for receiving the wavelength multiplexed signal, the LD/PD package 60 (or 80) serving as an optical tranceiver part and a fiber assembly with ferrule 43 that is provided with the wavelength multiplexing/demultiplexing coupler 101, all of which are fixedly supported by a single housing member 47.

The wavelength multiplexing/demultiplexing coupler 101 attached to the tip of the ferrule 43 is a prism shaped coupler provided with a film for multiplexing and demultiplexing the wavelength-multiplexed optical signal that is a reception signal into the first proximate wavelength band (e.g., λ1=1485 nm, λ2=1505 nm) and a separate reception signal into the second proximate wavelength band (e.g., λ1'=1545 nm, λ2'=1555 nm). The wavelength multiplexing/demultiplexing coupler 101 may have a cubic shape with length of the side being 1 mm.

The wavelength multiplexing/demultiplexing coupler 101 is directly fixed on the end surface of the ferrule 43 along the optical axis using an adhesive agent.

The wavelength multiplexing/demultiplexing coupler 101 is arranged such that the light beam of the second proximate wavelength band is reflected in a direction perpendicular to the optical axis of the optical fiber 44 and the light beam of the first proximate wavelength band is transmitted in the direction of the optical axis of the optical fiber 44.

The transmission light beam (e.g., $\lambda 0=1310$ nm) from the LD (not shown. See FIG. 16) accommodated in the LD/PD package 60 (or 80) is also transmitted in the direction of the optical axis of the optical fiber 44 in a manner similar to the first proximate wavelength band.

The LD/PD package 60 (or 80) is arranged at a position along the optical axis of the optical fiber 44 and the PD package 30 (or 20) is arranged at a position along the direction perpendicular to the optical axis of the optical fiber 44. Then, after adjusting the optical axis to an optimum position, the LD/PD package 60 (or 80) and the PD package 30 are fixed by laser welding.

The transmission light beam (e.g., $\lambda 0=1310$ nm) from the LD 45 passes directly through (in a straight direction) the multiplexing/demultiplexing coupler 101 along the optical axis and is transmitted through the optical fiber 44. Note that in FIG. 17, the LD/PD package is shown in a cross-sectional diagram in which the LD is not visible (See FIG. 16).

Among the wavelength-multiplexed optical signals arriving through the optical fiber 44, the multiplexed optical signal of the second proximate wavelength band (e.g., $\lambda 1'=1545$ nm, $\lambda 2'=1555$ nm) is reflected by the multiplexing/demultiplexing coupler 101 in a direction perpendicular to the optical axis of the optical fiber 44 and is incident on the PD package 30 (or 20).

The wavelength-multiplexed optical signal incident on the PD package 30 is separated by the diffraction grating plate 10' and is received by the PD element 7'.

The multiplexed optical signal of the first proximate wavelength band (e.g., $\lambda 1=1485$ nm, $\lambda 2=1505$ nm) is transmitted through the multiplexing/demultiplexing coupler 101 and is incident on the LD/PD package 60 (or 80).

The wavelength-multiplexed optical signal incident on the LD/PD package is separated by the diffraction grating plate 10 and is received by the PD element 7.

Accordingly, the wavelength-multiplexed bidirectional optical transmission module having functions illustrated in FIG. 18 can be achieved.

For all of the embodiments described above, the photoelectric transfer element may be formed as an array having individual receiving surfaces for each of the separated wavelengths.

Also, from the diffraction efficiency point of view, each of the above three embodiments has been configured under a condition where only first order diffracted light beams exist. However, for higher efficiency, the diffraction grating may be formed as a blazed grating.

Further, the present invention is not limited to these embodiments, and variations and modifications may be made without departing from the scope of the present invention.

The present application is based on Japanese priority application No. 2002-002784 filed on Jan. 9, 2002, the entire contents of which are hereby incorporated by reference.

What is claimed is:

1. A wavelength multiplexing bidirectional optical transmission module comprising:
    a transparent plate having first and second reflection surfaces opposing each other;
    a diffraction grating formed on a part of one of said first and second reflection surfaces to receive a wavelength multiplexed optical signal composed of at least two light beams of different wavelengths and to produce diffracted light beams for each of the different wavelengths at different angles; and
    photoelectric transfer elements receiving said diffracted light beams, respectively, that have been reflected and propagated between said first and second reflection surfaces.

2. The wavelength multiplexing bidirectional optical transmission module as claimed in claim 1, wherein said transparent plate is a wedge-shaped plate configured such that a distance between said first and second reflection surfaces varies gradually from one edge to the other edge of said transparent plate.

3. The wavelength multiplexing bidirectional optical transmission module as claimed in claim 1, wherein angles of diffraction of said diffracted light beams are selected such that said diffracted light beams are reflected and propagated under a total reflection condition according to Snell's law at a part of at least one of said first and second reflection surfaces.

4. The wavelength multiplexing bidirectional optical transmission module as claimed in claim 3, further comprising an optically transparent material in contact with said part of at least one of said first and second reflection surfaces where said diffracted light beams are under a total reflection condition, said optically transparent material having a refractive index greater than that of a material forming said transparent plate, said diffracted light beams reflected and propagated between said first and second reflection surfaces being retrieved in an external environment.

5. The wavelength multiplexing bidirectional optical transmission module as claimed in claim 1, wherein said transparent plate is provided with an optical filter film that reflects the diffracted light beam.

6. A wavelength multiplexing bidirectional optical transmission module comprising:
    a transparent plate having first and second reflection surfaces opposing each other;
    a diffraction grating formed on a part of one of said first and second reflection surfaces to receive a wavelength multiplexed optical signal composed of at least two light beams of a proximate wavelength band and to produce diffracted light beams for each wavelength at different angles;
    photoelectric transfer elements receiving said diffracted light beams, respectively, that have been reflected and propagated between said first and second reflection surfaces; and
    an optically transparent material in contact with said part of at least one of said first and second reflection surfaces where said diffracted light beams are under a total reflection condition, said optically transparent material having a refractive index greater than that of a material forming said transparent plate, said diffracted light beams reflected and propagated between said first and second reflection surfaces being retrieved in an external environment;
    wherein angles of diffraction of said diffracted light beams are selected such that said diffracted light beams are reflected and propagated under a total reflection condition according to Snell's law at a part of at least one of said first and second reflection surfaces.

7. An apparatus comprising:
    first and second surfaces; and
    a diffraction grating formed on a portion of the first surface, the first and second surfaces being positioned and having reflective characteristics so that a wavelength multiplexed optical signal comprising first and second lights at different wavelengths is incident on the diffraction grating and thereby produces first and second diffracted lights corresponding, respectively, to the first and second lights, and which are diffracted from the diffraction grating towards the second surface at different angles, the first and second diffracted lights being reflected from the second surface back toward the first surface and subsequently pass through the first surface; and photoelectric transfer elements receiving the first and second diffracted lights after passing through the first surface.

8. An apparatus comprising:

first and second surfaces; and a diffraction grating formed on a portion of the first surface, the first and second surfaces being positioned and having reflective characteristics so that a wavelength multiplexed optical signal comprising a plurality of lights at different wavelengths is incident on the diffraction grating and thereby produces a plurality of diffracted lights corresponding, respectively, to the plurality of lights, and which are diffracted from the diffraction grating towards the second surface at different angles, the plurality of diffracted lights being reflected from the second surface back toward the first surface and subsequently pass through the first surface; and photoelectric transfer elements receiving the plurality of diffracted lights after passing through the first surface.

9. An apparatus comprising:

first and second surfaces; and a diffraction grating formed on a portion of the first surface, the first and second surfaces being positioned and having reflective characteristics so that a wavelength multiplexed optical signal comprising first and second lights at different wavelengths is incident on the diffraction grating and thereby produces first and second diffracted lights corresponding, respectively, to the first and second lights, and which are diffracted from the diffraction grating towards, the second surface at different angles, the first and second diffracted lights being reflected from the second surface back toward the first surface, then reflected by the first surface back toward the second surface, and subsequently pass through the second surface; and photoelectric transfer elements receiving the first and second diffracted lights after passing through the second surface.

10. An apparatus comprising:

first and second surfaces; and a diffraction grating formed on a portion of the first surface, the first and second surfaces being positioned and having reflective characteristics so that a wavelength multiplexed optical signal comprising a plurality of lights at different wavelengths is incident on the diffraction grating and thereby produces a plurality of diffracted lights corresponding, respectively, to the plurality of lights, and which are diffracted from the diffraction grating towards the second surface at different angles, the plurality of diffracted lights being reflected from the second surface back toward the first surface, then reflected by the first surface back toward the second surface, and subsequently pass through the second surface; and photoelectric transfer elements receiving the plurality of diffracted lights after passing through the second surface.

* * * * *

UNITED STATES PATENT AND TRADEMARK OFFICE
CERTIFICATE OF CORRECTION

PATENT NO. : 6,792,181 B2
DATED : September 14, 2004
INVENTOR(S) : Seimi Sasaki

It is certified that error appears in the above-identified patent and that said Letters Patent is hereby corrected as shown below:

Column 20,
Line 6, after "towards", delete ","

Signed and Sealed this

Eighteenth Day of January, 2005

JON W. DUDAS
*Director of the United States Patent and Trademark Office*